(12) United States Patent
Kawai et al.

(10) Patent No.: US 10,658,217 B2
(45) Date of Patent: May 19, 2020

(54) TRANSFER CHAMBER

(71) Applicant: SINFONIA TECHNOLOGY CO., LTD., Tokyo (JP)

(72) Inventors: Toshihiro Kawai, Tokyo (JP); Takashi Shigeta, Tokyo (JP); Munekazu Komiya, Tokyo (JP); Yasushi Taniyama, Tokyo (JP)

(73) Assignee: SINFONIA TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 15/554,152

(22) PCT Filed: Feb. 5, 2016

(86) PCT No.: PCT/JP2016/053554
§ 371 (c)(1),
(2) Date: Aug. 28, 2017

(87) PCT Pub. No.: WO2016/136432
PCT Pub. Date: Sep. 1, 2016

(65) Prior Publication Data
US 2018/0047602 A1    Feb. 15, 2018

(30) Foreign Application Priority Data
Feb. 27, 2015    (JP) .................................. 2015-038389

(51) Int. Cl.
*H01L 21/677*    (2006.01)
*H01L 21/67*    (2006.01)
(Continued)

(52) U.S. Cl.
CPC ........ *H01L 21/67775* (2013.01); *H01L 21/02* (2013.01); *H01L 21/67017* (2013.01);
(Continued)

(58) Field of Classification Search
None
See application file for complete search history.

(56) References Cited

U.S. PATENT DOCUMENTS 6,123,120 A * 9/2000 Yotsumoto ........ H01L 21/67769
141/59
2004/0105738 A1 6/2004 Ahn et al.
(Continued)

FOREIGN PATENT DOCUMENTS

| JP | 2004-311940 A | 11/2004 |
|----|---------------|---------|
| JP | 2005-283049 A | 10/2005 |

(Continued)

OTHER PUBLICATIONS

International Search Report dated Apr. 19, 2016, issued in counterpart International Application No. PCT/JP2016/053554 (2 pages).
(Continued)

*Primary Examiner* — Jethro M. Pence
(74) *Attorney, Agent, or Firm* — Westerman, Hattori, Daniels & Adrian, LLP

(57) ABSTRACT

The transfer chamber transfers a wafer (W) as a transferred object to or from a processing device (6) by using a transfer robot (2) provided thereinside, and includes a circulation path (CL) formed inside of a transfer chamber (1) to circulate gas, a chemical filter unit (7) as a chemical filter provided in the midstream of the circulation path (CL), a humidity detector (HG2) as a humidity detection means which detects internal humidity, a gas supply means (NS) which supplies gas to the inside of the transfer chamber (1), and a moisture supply means (HS) which supplies moisture content to the inside of the transfer chamber (1). The moisture supply means (HS) is made to operate in accordance with a humidity detection value by the humidity detection means.

13 Claims, 5 Drawing Sheets

(51) Int. Cl.
*H01L 21/673* (2006.01)
*H01L 21/02* (2006.01)

(52) U.S. Cl.
CPC .. *H01L 21/67167* (2013.01); *H01L 21/67253* (2013.01); *H01L 21/67389* (2013.01)

(56) References Cited

U.S. PATENT DOCUMENTS

| | | | |
|---|---|---|---|
| 2009/0317214 A1* | 12/2009 | Hsiao | H01L 21/67017 414/217 |
| 2012/0083918 A1 | 4/2012 | Yamazaki | |
| 2014/0239484 A1 | 8/2014 | Matsuda et al. | |
| 2015/0170945 A1* | 6/2015 | Segawa | H01L 21/67017 414/217 |

FOREIGN PATENT DOCUMENTS

| | | |
|---|---|---|
| JP | 2012-49382 A | 3/2012 |
| JP | 2012-94822 A | 5/2012 |

OTHER PUBLICATIONS

Office Action dated Aug. 21, 2018, issued in counterpart Japanese application No. 2015-038389, with English translation. (5 pages).
Extended European Search Report dated Sep. 26, 2018, issued in counterpart application No. 16755181.1. (7 pages)

* cited by examiner

TRANSFER CHAMBER

TECHNICAL FIELD

The present invention relates to a transfer chamber capable of transferring a transferred object in a clean state without exposing to the outside air.

BACKGROUND ART

In the field of semiconductor, a semiconductor device is conventionally manufactured by applying various processing steps to a wafer.

In the semiconductor device manufacturing process, a particle-less and chemical component-less transfer environment of a wafer has been required, and a closed type container called an FOUP (Front-Opening Unified Pod) and a transfer chamber generally called an EFEM (Equipment Front End Module) which transfers a wafer to or from a processing device are used (see the following Patent Literature 1). In the transfer chamber, usually, fresh outside air in a clean room is taken into an FFU (Fun Filter Unit) installed in an upper part, and the air is made to flow downward inside of the transfer chamber and exhausted to the outside from a floor surface, so as to stably obtain a constant clean atmosphere.

Further, as the semiconductor device structure decreases in size recently, influences caused by the moisture content, oxygen, chemical components, and so forth affecting the semiconductor device structure are becoming a more serious problem. To address this problem, replacing the inside of the transfer chamber with N2 (nitrogen) gas which is inactive gas, and transferring a wafer under an N2 atmosphere have been proposed. In that case, in order to reduce consumption of N2 gas and to suppress running cost, since it is necessary to keep the inside clean while reducing the supply amount of fresh N2 gas, it is possible to make N2 gas circulate while passing through a filter.

Further, it is possible to provide a chemical filter to efficiently remove chemical components from the circulating N2 gas. Since chemical components can be carried into the transfer chamber with a wafer which is subjected to a process treatment by the processing device, it is possible to efficiently remove such chemical components by using a chemical filter as a gas processing device and keep a further cleaner atmosphere.

CITATION LIST

Patent Literature

Patent Literature 1: JP-A-2012-49382

SUMMARY OF THE INVENTION

Problems to be Solved by the Invention

If the gas is made to circulate inside of a transfer chamber as described above, since it is almost unachievable to exhaust chemical components carried in from the processing device to the outside, it is necessary to more efficiently remove the chemical components by using a chemical filter.

Since the chemical filter has a removal mechanism using a hydrolysis reaction regarding acid components and alkali components, removal of acid components or alkali components becomes difficult when humidity becomes excessively lower. However, since N2 gas supplied into the transfer chamber as described above usually contains substantially no moisture content, there is a possibility that inside of the transfer chamber may be in a low humidity state and chemical components cannot be removed sufficiently.

An object of the present invention is to effectively solve these issues, and more particularly, to provide a transfer chamber capable of maintaining a removing function of chemical components with a chemical filter by properly keeping internal humidity, and transferring a transferred object in a clean state.

Means for Solving the Problem

The following means are provided to solve the above-described problems.

A transfer chamber of the present invention is for transferring a transferred object to or from a processing device by using a transfer robot disposed thereinside, including: a circulation path formed inside of the transfer chamber to circulate gas; a chemical filter provided in the midstream of the circulation path; a humidity detection means configured to detect internal humidity; a gas supply means configured to supply gas to the inside of the transfer chamber, and a moisture supply means configured to supply moisture content to the inside of the transfer chamber, wherein the moisture supply means is made to operate in accordance with a humidity detection value by the humidity detection means.

Here, the above-described gas refers to substances other than gas of water, i.e., vapor.

With the configuration described above, since the internal humidity can be properly kept by operating the moisture supply means in accordance with the humidity detection value by the humidity detection means, the chemical filter is made to properly perform a hydrolysis reaction to remove chemical components and keep the inside clean. Therefore, it is possible to transfer the transferred object while keeping the clean state.

Further, in order to enable to stably supply moisture content to the transfer chamber, it is desirable that the moisture supply means is configured to cause moisture content to be contained in the gas in the midstream of a gas supply line from the gas supply means.

In order to enable to easily control humidity by the moisture supply means, it is desirable that the moisture supply means is constituted by a flow control unit connected to a moisture content supply source, a sprayer configured to spray water supplied from the flow control unit into the gas, and a vaporizer configured to evaporate the water sprayed into the gas.

In order to suppress condensation of the evaporated moisture content in the pipe and entrance of the excessive moisture content into the transfer chamber, it is desirable that a heat keeping means configured to keep a pipe warm is provided in the gas supply line at a position downstream of a supply of moisture content by the moisture supply means.

Effect of the Invention

According to the present invention described above, a transfer chamber capable of maintaining a removing function of chemical components with a chemical filter by properly keeping internal humidity, and transferring a transferred object in a clean state can be provided.

MODE FOR CARRYING OUT THE INVENTION

Hereinafter, an embodiment of the present invention will be described with reference to the drawings.

Figure 1:
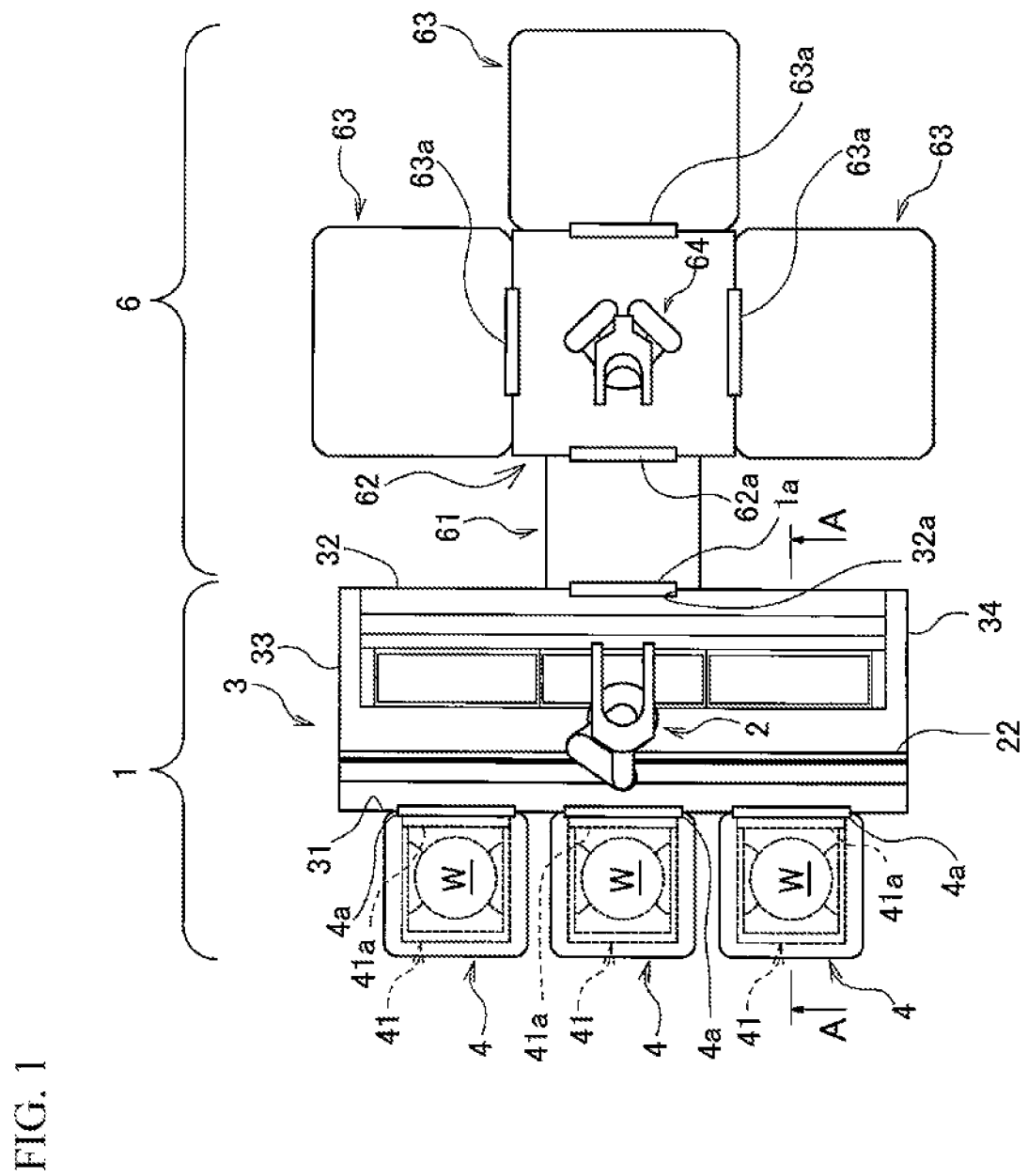
FIG. 1 is a plan view schematically illustrating a relationship between a transfer chamber and a processing device according to an embodiment of the present invention.

FIG. 1 is a plan view schematically illustrating a relationship between a transfer chamber 1 according to an embodiment of the present invention and a processing device 6 connected to the transfer chamber 1. As illustrated in FIG. 1, the transfer chamber 1 is constituted as module equipment generally referred to as an EFEM. In particular, the transfer chamber 1 includes a transfer robot 2 which transfers a wafer W which is a transferred object between prescribed transfer positions, a box-shaped housing 3 provided to surround the transfer robot 2, and a plurality of (three in FIG. 1) load ports 4 connected to the outside of a wall on the front side of the housing 3 (a front wall 31).

Here, in the present application, the direction in which the load ports 4 are connected when seen from the housing 3 is defined as the front side, the direction of a rear wall 32 opposite to the front wall 31 is defined as the rear side, and the directions orthogonally cross the front and rear directions and the vertical direction are defined as side directions. That is, the three load ports 4 are disposed along the side direction.

As illustrated in FIG. 1, a load lock chamber 61 which constitutes a part of the processing device 6 can be connected adjacent to an outside of the rear wall 32 of the transfer chamber 1, and when a door 1a provided between the transfer chamber 1 and the load lock chamber 61 is opened, inside of the transfer chamber 1 and the load lock chamber 61 can communicate with each other. Although various types of devices may be used as the processing device 6, generally, a configuration in which a relay chamber 62 is provided adjacent to the load lock chamber 61, and a plurality of (three in FIG. 1) processing units 63 which perform processing to the wafers W are provided adjacent to the relay chamber 62 is employed. A door 62a is provided between the relay chamber 62 and the load lock chamber 61, and doors 63a are provided between the relay chamber 62 and each of the processing units 63. When the doors 62a and 63a are opened, the load lock chamber 61 and the processing units 63 can communicate with each other, and the wafer W can be moved between the load lock chamber 61 and the processing units 63 by using the transfer robot 64 provided in the relay chamber 62.

Figure 2:
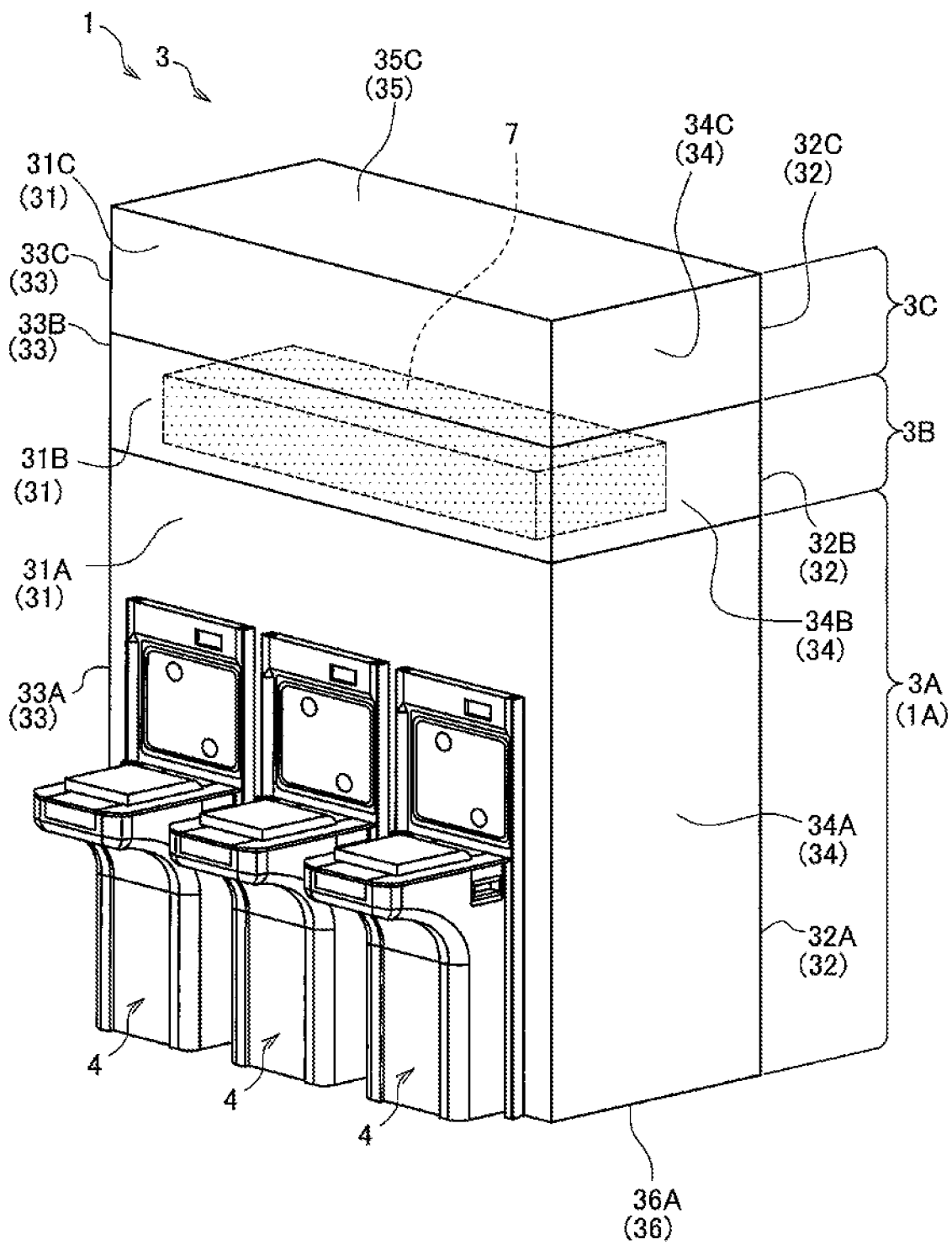
FIG. 2 is a perspective view schematically illustrating the transfer chamber.
Figure 3:
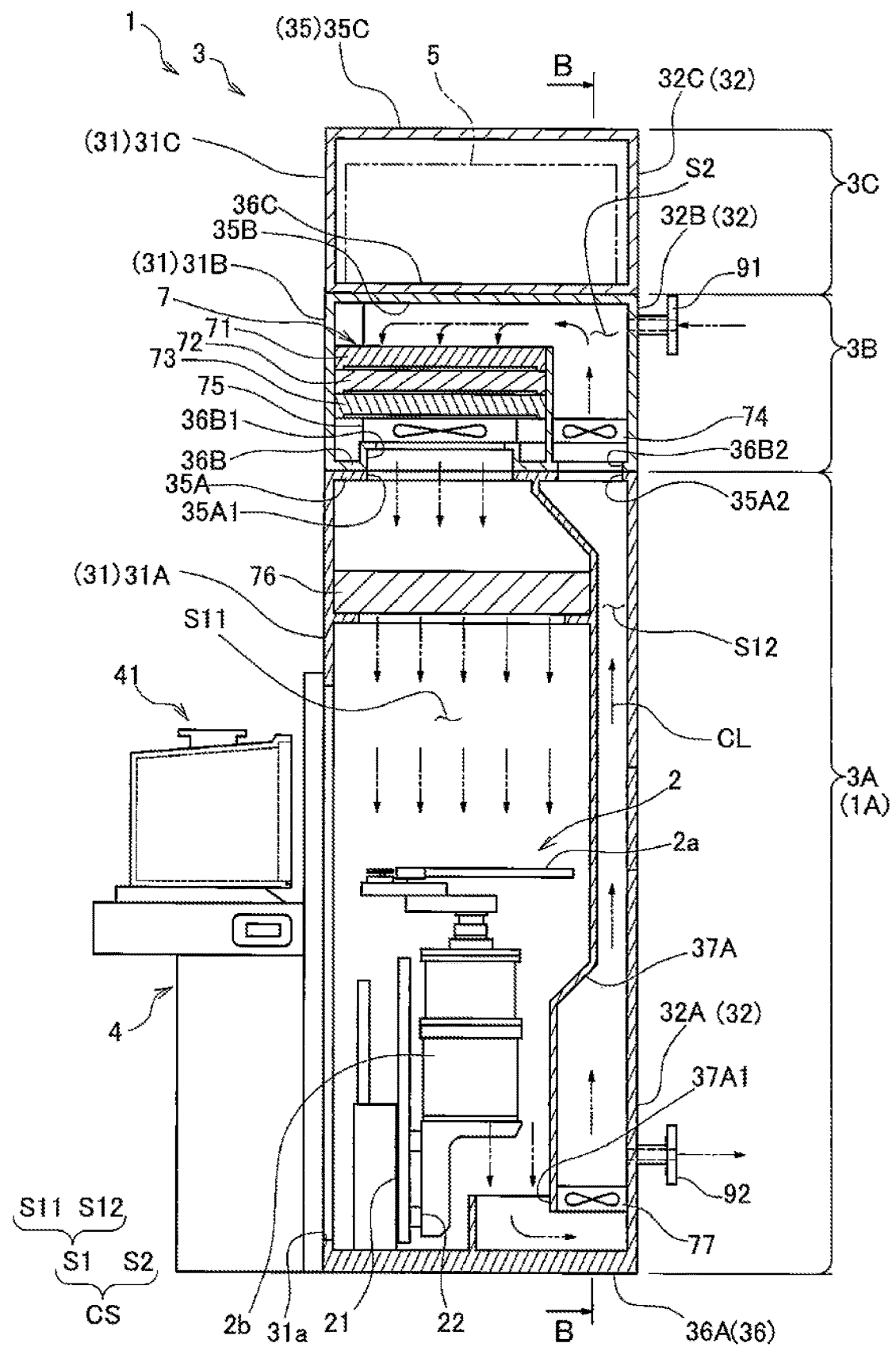
FIG. 3 is a cross-sectional view of the transfer chamber along line A-A of FIG. 1.

FIG. 2 is a perspective view of the transfer chamber 1 seen from the load ports 4 side, and FIG. 3 illustrates a cross-section of the transfer chamber 1 along line A-A of FIG. 1.

As illustrated in FIGS. 2 and 3, the housing 3 which constitutes the transfer chamber 1 includes a main body box 3A, a chemical filter box 3B as a gas processing box, and a control box 3C. The main body box 3A tip constitutes a transfer chamber main body 1A together with the internal transfer robot 2 (see FIG. 1) and the load ports 4 provided on the front wall 31. The main body box 3A, the chemical filter box 3B, and the control box 3C are mutually separable.

The front wall 31 of the housing 3 is constituted by front walls 31A, 31B, and 31C, the rear wall 32 is constituted by rear walls 32A, 32B, and 32C, the left side wall 33 is constituted by the left side walls 33A, 33B, and 33C, and the right side wall 34 is constituted by the right side walls 34A, 34B, and 34C of the main body box 3A, the chemical filter box 3B, and the control box 3C, respectively. An upper wall 35 of the housing 3 is constituted by an upper wall 35C of the control box 3C, and a bottom wall 36 of the housing 3 is constituted by a bottom wall 36A of the main body box 3A. A bottom wall 36B of the chemical filter box 3B is in contact with and fixed to the upper wall 35A of the main body box 3A, and a bottom wall 36C of the control box 3C is in contact with and fixed to the upper wall 35B of the chemical filter box 3B.

The load ports 4 are connected to an opening 31a provided in the front wall 31A of the main body box 3A, and a rectangular opening 32a (see FIG. 1) provided in the rear wall 32A is closed with the door 1a which is generally referred to as a gate valve. Two openings 35A1 and 35A2 are provided in the upper wall 35A of the main body box 3A, and openings 36B1 and 36B2 are provided in the bottom wall 36B of the chemical filter box 3B at positions corresponding to the openings 35A1 and 35A2. Therefore, a space S1 in the main body box 3A and a space S2 in the chemical filter box 3B communicate with each other to form a single substantially closed space CS.

The transfer robot 2 provided in the space S1 in the main body box 3A is constituted by an arm portion 2a provided with a pick on which the wafer W is placed and by which the wafer W is transferred, and a base portion 2b which supports the arm portion 2a from below and has a driving mechanism and an ascending/descending mechanism for moving the arm portion 2a. The base portion 2b is supported by the front wall 31A of the main body box 3A via a support portion 21 and a guide rail 22. The transfer robot 2 can move along the guide rail 22 which extends in the width direction in the main body box 3A. When a later-described control means 5 controls an operation of the transfer robot 2, the wafer W contained in a FOUP 41 placed on each of the load ports 4 can be transferred to the load lock chamber 61, and the wafer W after processing in each of the processing units 63 can be again transferred to the FOUP 41.

In the chemical filter box 3B, a chemical filter unit 7 which is generally referred to as a chemical filter is provided. The chemical filter unit 7 includes an organic matter removal filter 71 for removing an organic matter component among chemical components included in gas which passes through the organic matter removal filter 71, an acid removal filter 72 for removing an acid component, and an alkali removal filter 73 for removing an alkali component. The filters 71 to 73 are independently replaceable.

The control means 5 which is a control unit controlling the entire transfer chamber main body 1A is provided inside of the control box 3C. The control means 5 is constituted by an ordinary microprocessor provided with a CPU, memory, and an interface, and so forth. Programs necessary for processing are stored in the memory in advance. The CPU sequentially reads out and executes necessary programs to implement desired functions in cooperation with peripheral hardware resources. As described below, the control means 5 controls operations of the transfer robot 2 in the main body box 3A and the load ports 4, opening and closing of the door 1a and doors 4a, and supply of gas into the main body box 3A or the chemical filter box 3B, for example.

As illustrated in FIG. 3, the space S1 in the main body box 3A is divided into a transfer space S11 which is a space in which the transfer robot 2 operates and a gas return space S12 with an inner wall 37A extending from the bottom wall 36A to the upper wall 35A. An opening 37A1 is provided in a lower part of the inner wall 37A, and, the transfer space S11 and the gas return space S12 communicate with each other in the lower part through the opening 37A1. Fans 77 are provided in the lower part of the gas return space S12 to continue with the opening 37A1. When the fans 77 are driven, gas in the transfer space S11 is taken into the gas return space S12 and an upward air flow can be formed within the gas return space S12.

Figure 4:
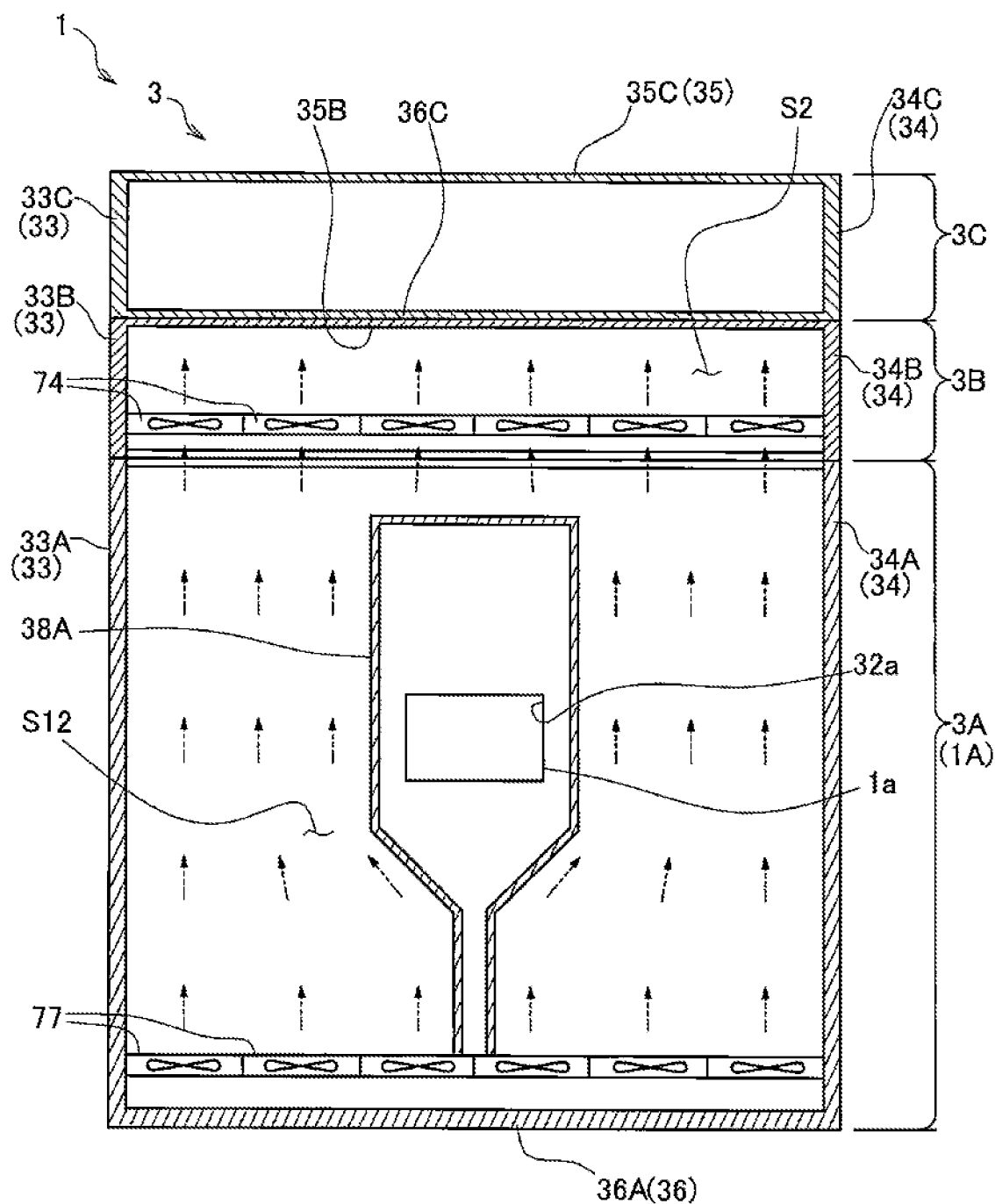
FIG. 4 is a cross-sectional view of the transfer chamber along line B-B of FIG. 3.

FIG. 4 is a cross-sectional view along line B-B of FIG. 3. As illustrated in FIG. 4, a wall portion 38A which surrounds the door 1a to the load lock chamber 61 (see FIG. 1) is formed at the central portion of the gas return space S12, and the space surrounding the door 1a is connected to the transfer space S11 (see FIG. 3). Therefore, the gas return space S12 is divided into two so as to evade the door 1a from below and join again in the upper part.

Returning to FIG. 3, the transfer space S11 and the gas return space S12 communicate with the space S2 in the chemical filter box 3B via the openings 35A1 and 35A2 of the upper wall 35A described above, respectively. Therefore, the transfer space S11 and the gas return space S12 communicate with each other via the space S2 in the chemical filter box 3B also in the upper part.

An FFU 76 is provided in the upper part of the transfer space S11, specifically a position separated slightly from the upper wall 35A. The FFU 76 sends the gas taken in from the space S2 in the chemical filter box 3B out downward so as to form a downward flow in the transfer space S11. A high-performance filter such as a HEPA (High Efficiency Particulate Air) filter and an ULPA (Ultra Low Penetration Air) filter is built in the FFU 76 so that the FFU 76 can collect fine particles contained in the gas passing therethrough.

In the chemical filter box 3B, an exhale fan 75 is provided between the opening 36B1 of the bottom wall 36B described above and the chemical filter unit 7, and an inhale fan 74 is provided above the opening 36B2. The opening 36B2 and the opening 35A2 which continues to the opening 36B2 function as gas inflow ports through which the gas is flown toward the chemical filter unit 7. The inhale fan 74 makes the gas flow into the chemical filter box 3B from the gas return space S12 through the openings 36B2 and 35A2. The opening 36B1 and the opening 35A1 which continues to the opening 36B1 function as gas outflow ports through which the gas is exhausted from the chemical filter unit 7. The exhale fan 75 can send gas which passed the chemical filter unit 7 into the transfer space S11 via the openings 35B1 and 35A1. Therefore, an amount of pressure loss due to the chemical filter unit 7 can be compensated for and a gas flow can be formed with two fans 74 and 75.

As described above, in the substantially closed space CS formed within the main body box 3A and the chemical filter box 3B, the gas which constitutes the internal atmosphere circulates along the following circulation path CL1. That is, the circulation path CL1 is formed to extend downward from the FFU 76 provided in the upper part of the transfer space S11, pass through the opening 37A1 and the fans 77 provided in the lower part of the inner wall 37A, extend upward in the gas return space S12, pass through the openings 35A2 and 36B2, extend into the space S2 in the chemical filter box 3B through the inhale fan 74, pass through the chemical filter unit 7, pass through the exhale fan 75 and the openings 36B1 and 35A1, and return to the transfer space S11. Therefore, it is possible to consider that the chemical filter unit 7 is provided in the midstream of the circulation path CL1.

Thus, in order to supply N2 gas and purge the substantially closed space CS in which the circulation path CL is formed, a gas supply port 91 is provided on a rear wall 32B of the chemical filter box 3B, and a gas exhaust port 92 is provided on the rear wall 32A of the main body box 3A.

Figure 5:
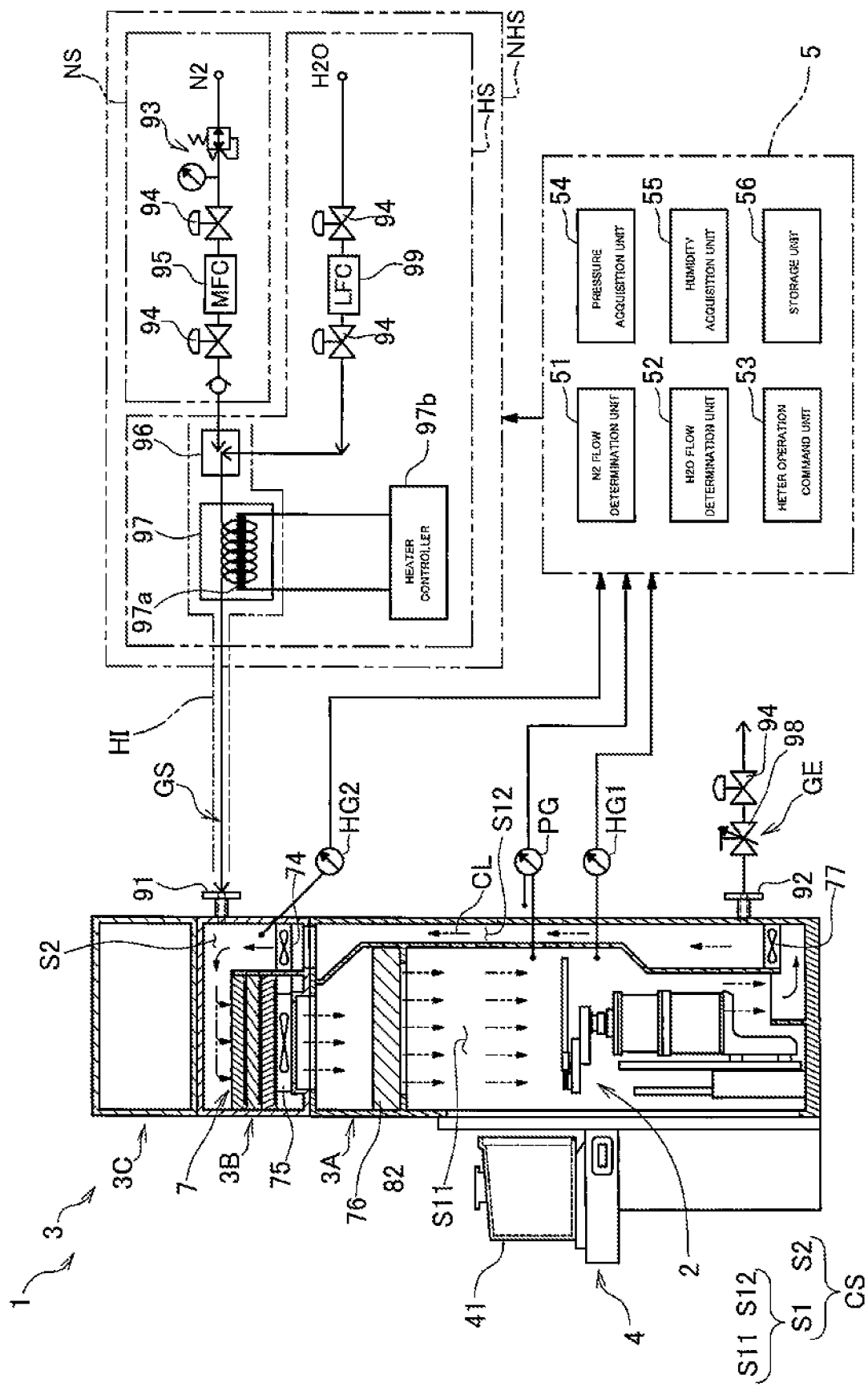
FIG. 5 is a block diagram schematically illustrating a configuration for controlling an internal atmosphere of the transfer chamber.

As illustrated in FIG. 5, a gas supply line GS and a gas exhaust line GE are connected to the gas supply port 91 and the gas exhaust port 92, respectively.

The gas supply line GS includes a gas supply means NS in which a regulator 93, a valve 94, an MFC (gas flow controller) 95, and the valve 94 are provided in this order in a pipe guided from an N2 gas supply source.

In the gas exhaust line GE, a flow control valve 98 and the valve 94 are provided in this order in a pipe connected to the gas exhaust port 92A, and an exhaust destination of the gas is connected to an end of the pipe.

Therefore, by supplying N2 gas from the gas supply port 91 while exhausting the gas by these components from the gas exhaust port 92, air is purged from the substantially closed space CS, and the space CS can be filled with N2 gas.

When the density of N2 gas is increased to a certain threshold or higher, the exhaust amount from the gas exhaust port 92A is reduced to a small amount while reducing the supply amount of N2 gas from the gas supply port 91 so as to keep the inside pressure positive. By making the internal gas circulate along the circulation path CL in this state, it is possible to remove particles and chemical components contained in the gas by using the FFU 76 and the chemical filter unit 7 and to keep the inside clean. Since N2 gas is dry gas which contains substantially no moisture content, it is possible to reduce the internal moisture content and prevent corrosion on the surface of the wafer W.

There is a case that removal performance of chemical components by the chemical filter unit 7 is lowered due to excessively reduced internal moisture content caused by the continued supply of N2 gas used for the replacement of the internal atmosphere as described above.

Among the organic matter removal filter 71, the acid removal filter 72, and the alkali removal filter 73 which constitute the chemical filter unit 7 as illustrated in FIG. 3, the organic matter removal filter 71 removes organic matter components by suction, whereas the acid removal filter 72 and the tip alkali removal filter 73 remove acid components and alkali components, respectively, by a hydrolysis reaction. Therefore, a certain or greater amount of moisture content is necessary for the removal of acid components or alkali components, and the removal performance is significantly lowered when humidity in the gas becomes excessively lower.

Then, in the present embodiment, in order to keep the internal humidity constant, the following moisture supply means HS is provided so that moisture content can be contained in N2 gas supplied from the gas supply means NS.

The moisture supply means HS includes the valve 94 connected to a pipe connected to a water supply source, an LFC (liquid flow controller) 99 as a flow control unit, the valve 94, a sprayer 96 generally called injection, a vaporizer 97, and a heater controller 97b which operates a heater 97a included in the vaporizer 97.

Specifically, the valve 94, the LFC 99, and the valve 94 are connected in this order to the pipe which is connected to the water supply source, and the pipe is connected to the sprayer 96 provided in the midstream of the gas supply line GS. Therefore, the moisture content to be applied can be determined by adjusting the water flow by the LFC 99, and the water can be contained in N2 gas as a fine spray of droplets through the sprayer 98. The vaporizer 97 constituted by a pipe formed in a coiled shape and the heater 97a for heating the pipe is provided downstream of the sprayer 96. When power is supplied from the heater controller 97b, the heater 97a can heat the gas flowing through the pipe and can make the water droplets contained in the gas evaporate. Further, a heat keeping means HI constituted by a heat insulation material for the pipe and a heat-retaining heater is provided in the pipe which constitutes the gas supply line GS at a portion from the sprayer 96 to the gas supply port 91 via the vaporizer 97. The heat keeping means HI prevents condensation of once evaporated moisture content and entrance of waterdrops into the chemical filter box 3B.

The above-described gas supply means NS and the moisture supply means HS constitute a gas/moisture supply means NHS for cooperatively supplying N2 gas containing moisture content into the substantially closed space CS.

In order to control such a gas/moisture supply means NHS, humidity detectors HG1 and HG2 as humidity detection means which detect humidity in the space S1 in the main body box 3A and the space S2 in the chemical filter box 3B, respectively, are provided. Further, a pressure sensor PG as a pressure detection means which detects a pressure difference between the space S1 in the main body box 3A and the outside is provided.

In order to control the gas supply means NS in accordance with the detected values from these sensors, the above-described control means 5 has the following configuration.

The control means 5 includes a gas (N2) flow determination unit 51, a water (H2O) flow determination unit 52, a heater operation command unit 53, a pressure acquisition unit 54, a humidity acquisition unit 55, and a storage unit 56.

A pressure target value and a humidity target value which are predetermined values defined in advance are stored in the storage unit 56. The pressure acquisition unit 54 can acquire output of the pressure sensor PG and then output as a pressure detection value. The humidity acquisition unit 55 can acquire output of the humidity detectors HG1 and HG2 and then output as humidity detection values.

The gas flow determination unit 51 is configured to determine the flow of N2 gas supplied from the gas supply line GS in accordance with the pressure detection value obtained from the pressure acquisition unit 54, and output a corresponding gas flow command value to the MFC 95. Specifically, if the pressure detection value is in a predetermined range around the pressure target value, the gas flow command value is kept, if the pressure detection value is smaller than the above-described predetermined range, the supply amount of N2 gas is increased, and if the pressure detection value is larger than the above-described predetermined range, the gas flow command value is changed so that the supply amount of N2 gas is reduced.

The water flow determination unit 52 is configured to determine the flow of water supplied from the moisture supply means HS in accordance with the humidity detection value by the humidity detector HG2 obtained via the humidity acquisition unit 55, and output a corresponding water flow command value to the LFC 99. Specifically, if the humidity detection value is in a predetermined range around the humidity target value, the water flow command value is kept, if the humidity detection value is smaller than the above-described predetermined range, the supply amount of water is increased, and if the humidity detection value is larger than the above-described predetermined range, the water flow command value is changed so that the supply amount of water is reduced. If the humidity detection value is larger than the humidity target value, the supply amount of water may be set to zero and only N2 gas may be supplied. Regarding the control of humidity, it is also desirable to control overshooting and hunching using PID control. When the above-described control is performed, the humidity detection value by the humidity detector HG1 is used for monitoring, however, the humidity detection value by the humidity detector HG2 may be used for monitoring and the humidity detection value by the humidity detector HG1 may be used for controlling.

The heater operation command unit 53 is configured to provide the heater controller 97b with a command to operate the heater 97a corresponding to the water flow command value determined by the water flow determination unit 52.

Since the transfer chamber 1 is configured as described above, the following operation can be performed.

First, in starting operation of the transfer chamber 1, as illustrated in FIG. 5, air is purged from the internal substantially closed space CS with N2 gas from the gas exhaust port 92 via the gas exhaust line GE while supplying N2 gas from the gas supply port 91 via the gas supply line GS. At this time, the pressure acquisition unit 54 acquires the pressure detection value from the output obtained from the pressure sensor PG, and in accordance with the pressure detection value, the gas flow determination unit 51 determines the gas flow command value and outputs to the MFC 95. Then, the MFC 95 adjusts the gas flow in accordance with the gas flow command value and the flow of N2 gas supplied to the substantially closed space CS is changed. In this manner, the inside of the substantially closed space CS can be kept to have positive pressure which is higher than the pressure of the outside so that entrance of particles from the outside can be prevented.

Further, the gas can be circulated inside along the circulation path CL by the control means 5 causing the FFU 76 and the fans 74, 75, and 77 to operate, and particles and chemical components contained in the gas can be removed with the chemical filter unit 7 and the FFU 76 so that a clean state can be obtained.

Further, the humidity acquisition unit 55 which constitutes the control means 5 acquires a humidity detection value from the output obtained from the humidity detector HG2, and in accordance with the humidity detection value, the water flow determination unit 52 determines a water flow command value, and outputs to the LFC 99. The LFC 99 adjusts the water flow in accordance with the water flow command value, and the moisture content contained in N2 gas supplied to the substantially closed space CS is adjusted. After provided as fine droplets by using the sprayer 96, the moisture content is provided to the chemical filter box 3B in an evaporated state by using the vaporizer 97 disposed downstream. In this manner, very low humidity that does not affect the hydrolysis reaction by the chemical filter unit 7 can be kept in the substantially closed space CS, so that chemical components can be effectively removed and corrosion of the wafer W caused by excessively high humidity can also be prevented.

Since the internal atmosphere becomes clean as described above, an ordinary state in which the supply amount of N2 gas is reduced while keeping the positive pressure in the substantially closed space CS is started, and consumption of N2 gas is reduced. Then, the wafer W which is the transferred object can be transferred by the control means 5 causing the transfer robot 2, the load ports 4 and each of the doors 1a and 4a illustrated in FIG. 1 to operate while keeping the clean state.

Further, since moisture control in accordance with the humidity detection value by the above-described humidity detector HG2 is performed continuously also during normal operation, removal performance by the chemical filter unit 7 can be maintained, and even if chemical components enter with the wafer W from the processing device 6 side, the chemical components can be removed properly and the inside can be kept in the clean state.

As described above, the transfer chamber 1 in the present embodiment is configured to transfer the wafer W as the transferred object to or from the processing device 6 by using the transfer robot 2 provided thereinside, and include a circulation path CL formed inside of the transfer chamber 1 to circulate gas, the chemical filter unit 7 as the chemical filter provided in the midstream of the circulation path CL, the humidity detector HG2 as the humidity detection means which detects internal humidity, the gas supply means NS which supplies gas to the inside of the transfer chamber 1, and the moisture supply means HS which supplies moisture content to the inside of the transfer chamber 1. The moisture supply means HS is made to operate in accordance with the humidity detection value by the humidity detection means.

With the configuration described above, since the internal humidity can be properly kept by operating the moisture supply means HS in accordance with the humidity detection value by the humidity detector HG2, the chemical filter unit 7 can be made to properly perform a hydrolysis reaction to remove chemical components and keep the inside clean. Therefore, it is possible to transfer the wafer W while keeping the clean state, and the yield of semiconductor devices manufactured using the wafer W can be improved.

Further, since the moisture supply means HS is configured to cause moisture content to be contained in the gas in the midstream of the gas supply line GS from the gas supply means NS, it is possible to more stably supply the moisture content.

Further, the moisture supply means HS is constituted by the LFC 99 as a flow control unit connected to the moisture content supply source, the sprayer 96 which sprays water supplied from the LFC 99 into the gas, and the vaporizer 97 which evaporates the water sprayed into the gas, it is possible to easily and properly control the supplied moisture content.

Further, since the heat keeping means HI which keeps the pipe warm may be provided in the gas supply line GS located downstream of the supply of the moisture content by the moisture supply means HS, a temperature drop of the gas to or below the dew point after the supply of moisture content by the moisture supply means HS and condensation can be prevented. Therefore, it is possible to properly keep the internal humidity and suppress entrance of excessive moisture content.

Note that the specific configuration of each part is not limited to that of the embodiment described above.

For example, although N2 gas is used as the gas with which the inside is filled in the above-described embodiment, Ar (argon) gas which is the same inactive gas may also be used suitably. Further, substances other than N2 gas or Ar gas, except for substances other than gas of water, i.e., vapor, may be used. The gas may be changed depending on the contents of the process to the wafer W which is the transferred object.

The transfer chamber 1 may be used to transfer transferred objects other than the wafer W.

Although the moisture supply means HS is configured to supply moisture content to N2 gas to be supplied to the substantially closed space CS in the above-described embodiment, the moisture content may be directly supplied in the substantially closed space CS. Also in this case, the same effects as those described above can be provided.

Further, although humidity in the substantially closed space CS is kept to the target humidity by operating the moisture supply means HS in accordance with the detected value by the humidity detector HG2 in the above-described embodiment, a prescribed amount of moisture content may be supplied from the moisture supply means HS every predetermined time instead of using the detected value by the humidity detector HG2. Also in this case, humidity in the substantially closed space CS can be kept at the target humidity, and the same effects as those described above can be provided. Further, since the humidity detector HG2 becomes unnecessary, manufacturing cost may be further reduced.

Various changes may be made to other configurations without departing from the scope and spirit of the present invention.

DESCRIPTION OF REFERENCE NUMERALS 1 transfer chamber
2 transfer robot
5 control means
6 processing device
7 chemical filter unit (chemical filter)
96 sprayer
97 vaporizer
99 LFC (flow control unit)
CL circulation path
GE gas exhaust line
GS gas supply line
HS moisture supply means
HG1, HG2 Humidity detector (humidity detection means)
HI heat keeping means
NS gas supply means
W wafer (transferred object)

The invention claimed is:

1. A transfer chamber for transferring a transferred object to or from a processing device by using a transfer robot disposed thereinside, comprising:
 a circulation path formed in an inside of the transfer chamber by dividing an inner space of the transfer chamber with an inner wall, and circulating gas;
 a chemical filter provided in a midstream of the circulation path, and comprising an acid removal filter removing acid components by a hydrolysis reaction and an alkali removal filter removing alkali components by a hydrolysis reaction;
 a humidity detector configured to detect internal humidity;
 a gas supply line supplying the gas from a gas supply source to the inside of the transfer chamber;
 a moisture supply line supplying moisture content from a water supply source to the inside of the transfer chamber; and
 a pressure sensor configured to detect pressure to the inside of the transfer chamber.

2. The transfer chamber according to claim 1, wherein a gas suction opening of the circulation path for circulating the gas is provided below a transfer arm of the transfer robot.

3. The transfer chamber according to claim 1, further comprising a main body box which forms a part of the circulation path and in which the transfer robot is provided, and a gas processing box which forms a part of the circulation path and in which the chemical filter is accommodated, wherein a space in the main body box is divided into a transfer space in which the transfer robot operates and a gas return space configured such that the gas can be returned from the main body box to the gas processing box, and a gas suction opening for circulating the gas in the transfer space to the gas return space is provided in the lower part of the transfer space.

4. The transfer chamber according to claim 1, wherein the moisture supply line includes a liquid flow controller, connected to a water supply source, for adjusting an amount of water contained in the gas in a midstream of the gas supply line; a sprayer which sprays water supplied from the liquid flow controller into the gas; and a vaporizer for vaporizing the water sprayed into the gas in the midstream of the gas supply line, and wherein the liquid flow controller is configured to operate in accordance with a humidity detection value by the humidity detector.

5. The transfer chamber according to claim 4, wherein a heat insulation device configured to keep a pipe warm is provided in the gas supply line at a position downstream of moisture supply parts.

6. An equipment front end module (EFEM) wherein a downward flow is formed by an inactive gas sent out downward from a fan filter unit in a housing for transporting a transferred object to or from a processing device by using a transfer robot disposed inside the housing, wherein the housing includes a transfer space which contains the transfer robot, a gas processing space which contains a gas processing device and a gas return space which allows the inactive gas to return from the transfer space to the gas processing space, wherein the transfer space and the gas return space are divided and separated from each other with an inner wall, wherein a circulation space is formed by communication between the transfer space, the gas processing space, and the gas return space, and the inactive gas is supplied from a gas supply line to the circulation space, and wherein the gas processing device is a chemical filter comprising an acid removal filter removing acid components by a hydrolysis reaction, and an alkali removal filter removing alkali components by a hydrolysis reaction, the EFEM includes a humidification device for humidifying the supplied gas supplied to the chemical filter with moisture content from a water supply source.

7. The EFEM according to claim 6, wherein the inactive gas circulates to expand downward in the circulation space by the fan filter unit that forms the downward flow in the transfer space, enters into the gas return space through an inlet port provided in a lower part of the transfer space, extends upward in the gas return space, passes through the gas processing device, and returns to the transfer space.

8. The EFEM according to claim 6, and wherein the acid components and alkali components are carried into the transfer space from the processing device.

9. The EFEM according to claim 6, further comprising a pressure detection device configured to detect the pressure to the inside of the housing to allow the volume of the inactive gas to be supplied from the gas supply line based on a value detected by the pressure detection device, wherein a humidity detector is configured to detect internal humidity of the housing to allow the humidification device to operate based on a value detected by the humidity detector.

10. The EFEM according to claim 6, wherein the housing includes a main body box forming the transfer space, and a gas processing box forming the gas processing space, and humidifying supply gas circulating in the circulation space in the gas processing box.

11. The EFEM according to claim 10, wherein the gas processing device is provided with the gas supply line, and wherein humidification of the supplied gas which circulates in the circulation space by the humidification device is performed through the gas supply line.

12. The EFEM according to claim 10, wherein the housing has a control box provided above the gas processing box, and the humidification device is controlled by a controller unit provided inside the control box.

13. The EFEM according to claim 11, wherein the housing has a control box provided above the gas processing box, and the humidification device is controlled by a controller unit provided inside the control box.

* * * * *